United States Patent
Zhang et al.

(10) Patent No.: US 6,870,181 B2
(45) Date of Patent: Mar. 22, 2005

(54) ORGANIC CONTACT-ENHANCING LAYER FOR ORGANIC FIELD EFFECT TRANSISTORS

(75) Inventors: Jie Zhang, Buffalo Grove, IL (US); Paul Brazis, South Elgin, IL (US); Daniel Gamota, Palatine, IL (US); Krishna Kalyanasundaram, Chicago, IL (US); Steven Scheifers, Hoffman Estates, IL (US); Jerzy Wielgus, Park Ridge, IL (US); Abhijit Roy Chowdhuri, Oak Park, IL (US)

(73) Assignee: Motorola, Inc., Schaumburg, IL (US)

( * ) Notice: Subject to any disclaimer, the term of this patent is extended or adjusted under 35 U.S.C. 154(b) by 33 days.

(21) Appl. No.: 10/187,516

(22) Filed: Jul. 2, 2002

(65) Prior Publication Data

US 2004/0004213 A1 Jan. 8, 2004

(51) Int. Cl.[7] .................................................. H01L 35/24
(52) U.S. Cl. ........................ 257/40; 257/324; 257/411
(58) Field of Search ......................... 257/40, 324, 410, 257/411; 438/99

(56) References Cited

U.S. PATENT DOCUMENTS

| | | | |
|---|---|---|---|
| 5,347,144 A | | 9/1994 | Garnier et al. |
| 5,796,121 A | | 8/1998 | Gates et al. |
| 6,265,243 B1 | * | 7/2001 | Katz et al. ..................... 438/99 |
| 6,326,640 B1 | | 12/2001 | Shi et al. |
| 6,433,359 B1 | | 8/2002 | Kelley et al. |
| 6,617,609 B2 | | 9/2003 | Kelley et al. |
| 6,621,098 B1 | * | 9/2003 | Jackson et al. ................ 257/40 |
| 6,783,849 B2 | * | 8/2004 | Yitzchaik ...................... 428/339 |

OTHER PUBLICATIONS

Swiggers, M.L., et al., "Orientation of pentacene films using surface alignment layers . . . ," Applied Physics Letters, vol. 79, No. 9, Aug. 27, 2001, pp 1300–1302.*

Lin, Y.–Y. et al. "Stacked Pentacene Layer Organic Thin-Film Transistors with Improved Characteristics." IEEE Electron Device Letters, Dec. 1997, pp. 606–608, vol. 18, No. 12.

* cited by examiner

*Primary Examiner*—Sara Crane

(57) ABSTRACT

An organic field effect transistor utilizes a bifunctional contact-enhancing agent at various interfaces to improve carrier mobility through the organic semiconductor layer, to improve carrier injection, and to enhance adhesion via a bifunctional mechanism. The contact-enhancing agent can be situated between the gate electrode (2) and the dielectric layer (3) to form a chemical or physical bond between the gate electrode and the dielectric layer. It can also be situated between the dielectric layer and the organic semiconducting layer (4), or between the source and drain electrodes (5, 6) and the organic semiconducting layer.

28 Claims, 2 Drawing Sheets

ORGANIC CONTACT-ENHANCING LAYER FOR ORGANIC FIELD EFFECT TRANSISTORS

CROSS REFERENCE TO RELATED APPLICATION

This application is related to U.S. Ser. No. 10,187,737, by Jie Zhang, Paul Brazis, Daniel Gamota, Krishna Kalyanasundaram, Steven Scheifers, Jerzy Wielgus, and Abhijit Roy Chowdhuri, entitled "INTEGRATED CIRCUIT INCLUDING FIELD EFFECT TRANSISTOR AND METHOD OF MANUFACTURE," filed concurrently herewith, and assigned to Motorola, Inc.

This invention was made with United States Government support under Agreement No. 70NANB0H3033 awarded by the National Institute of Standards and Technology (NIST). The United States Government has certain rights in the invention.

FIELD OF THE INVENTION

This invention relates generally to organic field effect transistors. More particularly, this invention relates to the use of a contact-enhancing agent between various portions of an organic field effect transistor to improve carrier injection, mobility and adhesion in the transistor structure.

BACKGROUND OF THE INVENTION

Field effect transistors (FETs) are transistors in which the resistance of the current path from source to drain is modulated by applying a transverse electric field between grid or gate electrodes. The electric field varies the thickness of the depletion layer between the gates, thereby modifying the conductance. Organic field effect transistors (OFETs) utilize an organic semiconductor channel, such as polythiophene compounds, in place of conventional inorganic semiconducting materials. An OFET as generally practiced in the prior art is depicted in FIG. 1, where a gate electrode 2 is situated on a substrate 1, a gate dielectric layer 3 is disposed on the gate electrode 2, an organic semiconductor layer 4 used as an active layer of the transistor is formed on the gate dielectric layer, and source and drain electrodes 5 and 6 are formed on the organic semiconductor layer 4. The gate electrode 2 is typically formed in the organic transistor forming region by depositing a gate metal such as, for example, Cr/Au or Ti/Au and the thickness of the gate electrode 2 is typically about 1000 Ångstroms. On the gate electrode 2 in the transistor region, a dielectric layer 3 that insulates the gate electrode from other members is made of a non-conducting substance and is formed by a vacuum evaporation or a spin coating method with a nominal thickness of 3 micrometers and a conductivity less than $10^{-14}$ ohm/cm. The organic semiconductor layer 4 used as an active layer of the transistor is deposited by a spin coating or vacuum deposition method on the gate-insulating layer 3. Preferably, the thickness of the organic semiconductor layer 4 is less than 100 nm. The organic semiconductor layer 4 of the OFET can be made of a charge transfer complex or a thiophene polymer in order to enhance the mobility and the driving current of the field effect transistor. By way of example, the charge transfer complex is selected from the group consisting of copper phthalocyanine, tetrametyltetraselennafulvalene, bis (tetra-n-butylammonium) palladium (II), tetrathiafulvalene, and 7,7,8,8-tetracyano-p-quinodimethane. Then, a gold film with high electrical conductivity is deposited and the deposited gold film is etched so as to form a source electrode 5 and a drain electrode 6.

The interfaces in an OFET are critical to its performance. Carrier injection from the source and drain electrodes into the organic semiconducting layer is a function of the intimacy of the contact. Similarly, the interface created between the dielectric and semiconducting layer must be planar, uniform, oriented, promote adhesion, and/or act as a coupling agent. Traditional interfaces consist of gold, silver, copper, palladium, platinum, and other noble metals, in contact with the organic semiconductor. These metal-semiconductor interfaces lack optimal complementary surface energies to permit totally intimate contact. This results in poor carrier injection, lowered mobility, and poor device performance, due in part to the lack of either chemical bonding or surface wetting. If the quality of these prior art interfaces could be improved, then an OFET with substantially improved performance could be realized.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
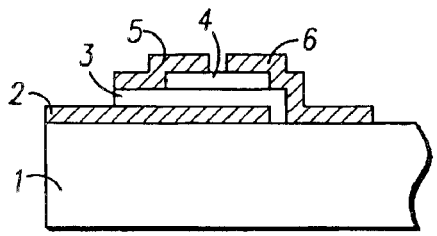
FIG. 1 is a cross-sectional schematic representation of an organic field effect transistor as practiced in the prior art.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

A related patent application, attorney's docket number CML00208T, filed concurrently herewith, is hereby incorporated by reference. An organic field effect transistor utilizes a bifunctional contact-enhancing agent at various interfaces to improve mobility through the organic semiconductor layer and to improve carrier injection via a bifunctional mechanism. The contact-enhancing agent can be situated between the gate electrode and the dielectric layer to form a chemical or physical bond between the gate electrode and the dielectric layer. It can also be situated between the dielectric layer and the organic semiconducting layer, or between the electrodes and the organic semiconducting layer.

Figure 2:
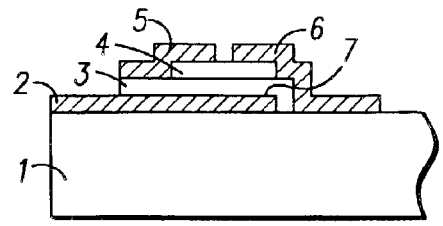
FIG. 2 is a cross-sectional schematic representation of an organic field effect transistor having a bifunctional contact-enhancing interface consistent with a first embodiment of the present invention.

As described above, organic field effect transistors (OFETs) utilize an organic semiconductor channel, such as polythiophene compounds, in place of conventional inorganic semiconducting materials. A first embodiment of our invention is now depicted in FIG. 2, in a cross sectional format similar to the above depiction of the prior art, so that the reader may readily distinguish the novel features. The various elements depicted are not to relative scale for ease in distinguishing these elements to the reader's eye. A gate electrode 2 is formed in a certain configuration on a substrate 1. Overlying the gate electrode 2 and situated between the gate electrode and a dielectric layer 3 lies a thin, uniform, contact-enhancing layer 7. While reference numeral 7 is described herein as a layer, a reader with ordinary skill in the art will appreciate, that in practice, the interface is extremely thin, in some cases approaching a monomolecular layer, and may more properly be described as a contact-enhancing interface. This thin, uniform, contact-enhancing layer 7 is comprised of a bifunctional molecular agent that forms an interface and interacts either chemically or physically with the two opposing surfaces that it contacts. The molecular agent is engineered to planarize, make uniform, orient, promote adhesion, and/or act as a coupling agent, and is selected to create a thermodynamically preferable high energy bond. This bifunctional contact-enhancing agent forms a stable chemical bond between the dielectric layer 3 and the underlying gate electrode 2. The interface should preferably be uniformly thin, submicron in dimensions, substantially free of pinholes, conductive, preferably of small band gap, and stable. It can be applied to the gate electrode 2 by deposition from solution, for example by spin coating, by jetting, pad printing, dipping, curtain coating, etc. Once the contact-enhancing agent has been applied and suitably cured or dried to remove residual solvents or carriers, the dielectric layer 3 can then be directly applied on top of the intermediate layer by conventional deposition technologies, so that it is now tightly bonded to the contact-enhancing interface 7 and subsequently, to the underlying gate electrode 2. A semiconducting layer 4 is then disposed on the dielectric layer 3, and source electrode 5 and drain electrode 6 are added on the semiconducting layer 4 in conventional fashion to complete our novel organic field effect transistor.

Figure 3:
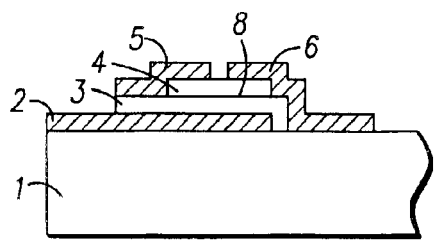
FIG. 3 is a cross-sectional schematic representation of an organic field effect transistor having a bifunctional contact-enhancing interface consistent with a second embodiment of the present invention.

In a second embodiment of our invention depicted in FIG. 3, a gate electrode 2 is formed in a certain configuration on a substrate 1. A dielectric layer 3 is situated on top of the gate electrode 2. Overlying the dielectric layer 3 and situated between the dielectric layer and a semiconducting layer 4 is a thin, uniform, contact-enhancing layer 8. In practice, this layer 8 is extremely thin, in some cases approaching a monomolecular layer, and may more properly be described as a contact-enhancing interface. This thin, uniform, contact-enhancing layer 8 is comprised of a bifunctional molecular agent that forms an interface and interacts either chemically or physically with the two opposing surfaces that it contacts. The molecular agent is engineered to planarize, make uniform, orient, promote adhesion, and/or act as a coupling agent, and is selected to create a thermodynamically preferable high energy bond. This bifunctional contact-enhancing agent forms a stable chemical bond between the dielectric layer 3 and the semiconducting layer 4. The interface should preferably be uniformly thin, submicron in dimensions, substantially free of pinholes, conductive, preferably of small band gap, and stable. It can be applied to the dielectric layer 3 by deposition from solution, for example by spin coating, or by jetting or pad printing. Once the bifunctional contact-enhancing agent has been applied and suitably cured or dried, the semiconducting layer 4 is then applied directly on top of the contact-enhancing layer 8 by conventional deposition technologies, so that it is now tightly bonded to the contact-enhancing layer 8 and subsequently, to the underlying dielectric layer 3. A source electrode 5 and drain electrode 6 are then formed on the semiconducting layer 4 in conventional fashion to complete our novel organic field effect transistor.

Figure 4:
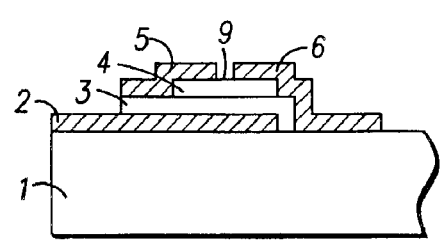
FIG. 4 is a cross-sectional schematic representation of an organic field effect transistor having a bifunctional contact-enhancing interface consistent with a third embodiment of the present invention.

In a third embodiment of our invention depicted in FIG. 4, a gate electrode 2 is formed on a substrate 1. A dielectric layer 3 is situated on top of the gate electrode 2. A semiconducting layer 4 is then applied directly on top of the dielectric layer 3. Overlying the semiconducting layer 4 and situated between it and the source and drain electrodes 5, 6 is a thin, uniform, contact-enhancing layer 9. In practice, this layer 9 is extremely thin, in some cases approaching a monomolecular layer, and may more properly be described as a contact-enhancing interface. This thin, uniform, contact-enhancing layer 9 is comprised of a bifunctional molecular agent that forms an interface and interacts either chemically or physically with the two opposing surfaces that it contacts. This molecular agent is formulated to enhance carrier injection from the electrodes to the organic semiconductor, and to complement the functional group of the organic semiconducting material. This bifunctional contact-enhancing agent forms a stable chemical bond between the semiconducting layer 4 and the source and drain electrodes. The interface should preferably be uniformly thin, submicron in dimensions, substantially free of pinholes, conductive, preferably of small band gap, and stable. It can be applied to the semiconducting layer 4 by deposition from solution, for example by spin coating, or by jetting or pad printing. Once the bifunctional contact-enhancing agent has been applied and suitably cured or dried, the source and drain electrodes 5, 6 are then applied directly on top of the contact-enhancing layer 9 and the semiconducting layer 4 by conventional deposition technologies, so that they are now tightly bonded to the contact-enhancing layer and subsequently, to the underlying semiconducting layer 4.

Figure 5:
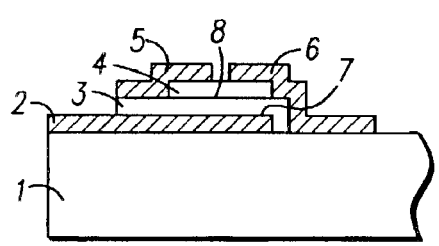
FIG. 5 is a cross-sectional schematic representation of an organic field effect transistor having two molecular contact-enhancing interfaces consistent with a fourth embodiment of the present invention.

In a fourth embodiment of our invention depicted in FIG. 5, a gate electrode 2 is situated on a substrate 1, a dielectric layer 3 is situated above the gate electrode 2, an organic semiconductor layer 4 used as an active layer of the transistor is formed on the dielectric layer, and source and drain electrodes 5 and 6 are formed on the organic semiconductor layer 4. In addition, this embodiment incorporates two of the contact-enhancing interfaces explained above. The first interface is a thin, uniform, contact-enhancing layer 7 situated between the gate electrode 2 and the dielectric layer 3. This contact-enhancing layer 7 is comprised of a bifunctional molecular agent that forms an interface and interacts either chemically or physically with the two opposing surfaces that it contacts to form a stable bond between the gate electrode 2 and the dielectric layer 3. A second contact-enhancing layer 8 is situated between the dielectric layer 3 and the semiconducting layer 4. Like the first layer 7, layer 8 is also comprised of a bifunctional molecular agent that forms an interface to interact either chemically or physically with the two opposing surfaces that it contacts to form a stable bond between the dielectric layer 3 and the semiconducting layer 4.

Figure 6:
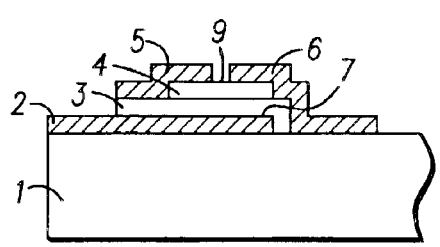
FIG. 6 is a cross-sectional schematic representation of an organic field effect transistor having two molecular contact-enhancing interfaces consistent with a fifth embodiment of the present invention.

In a fifth embodiment of our invention depicted in FIG. 6, a gate electrode 2 is situated on a substrate 1, a dielectric layer 3 is situated above the gate electrode 2, an organic semiconductor layer 4 used as an active layer of the transistor is formed on the dielectric layer, and source and drain electrodes 5 and 6 are formed on the organic semiconductor layer 4. In addition, this embodiment incorporates two of the contact-enhancing interfaces explained above. The first interface is a thin, uniform, contact-enhancing layer 7 situated between the gate electrode 2 and the dielectric layer 3. This contact-enhancing layer 7 is comprised of a bifunctional molecular agent that forms an interface and interacts either chemically or physically with the two opposing surfaces that it contacts to form a stable bond between the gate electrode 2 and the dielectric layer 3. A second contact-enhancing layer 9 is situated between the semiconducting layer 4 and the source/drain electrodes 5, 6. Like the first layer 7, layer 9 is also comprised of a bifunctional molecular agent that forms an interface to interact either chemically or physically with the two opposing surfaces that it contacts to form a stable bond between the semiconducting layer 4 and the source/drain electrodes 5, 6.

Figure 7:
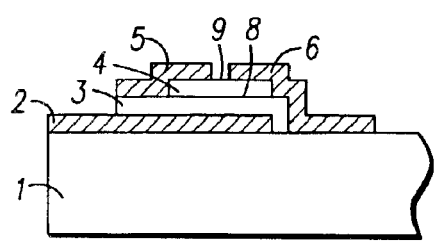
FIG. 7 is a cross-sectional schematic representation of an organic field effect transistor having two molecular contact-enhancing interfaces consistent with a sixth embodiment of the present invention.

In a sixth embodiment of our invention depicted in FIG. 7, a gate electrode 2 is situated on a substrate 1, a dielectric layer 3 is situated above the gate electrode 2, an organic semiconductor layer 4 used as an active layer of the transistor is formed on the dielectric layer, and source and drain electrodes 5 and 6 are formed on the organic semiconductor layer 4. In addition, this embodiment incorporates two of the contact-enhancing interfaces explained above. The first interface is a thin, uniform, contact-enhancing layer 8 situated between the dielectric layer 3 and the semiconducting layer 4. This contact-enhancing layer 8 is comprised of a bifunctional molecular agent that forms an interface and interacts either chemically or physically with the two opposing surfaces that it contacts to form a stable bond between the dielectric layer 3 and the semiconducting layer 4. A second contact-enhancing layer 9 is situated between the semiconducting layer 4 and the source/drain electrodes 5, 6. Like the first layer 8, layer 9 is also comprised of a bifunctional molecular agent that forms an interface to interact either chemically or physically with the two opposing surfaces that it contacts to form a stable bond between the semiconducting layer 4 and the source/drain electrodes 5, 6.

Figure 8:
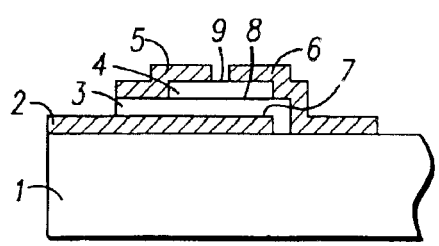
FIG. 8 is a cross-sectional schematic representation of an organic field effect transistor having three molecular contact-enhancing interfaces consistent with a seventh embodiment of the present invention.

In a seventh embodiment of our invention depicted in FIG. 8, a gate electrode 2 is situated on a substrate 1, a dielectric layer 3 is situated above the gate electrode 2, an organic semiconductor layer 4 used as an active layer of the transistor is formed on the dielectric layer, and source and drain electrodes 5 and 6 are formed on the organic semiconductor layer 4. In addition, this embodiment incorporates three of the contact-enhancing interfaces explained above. The first interface is a thin, uniform, contact-enhancing layer 7 situated between the gate electrode 2 and the dielectric layer 3. This contact-enhancing layer 7 is comprised of a bifunctional molecular agent that forms an interface and interacts either chemically or physically with the two opposing surfaces that it contacts to form a stable bond between the gate electrode 2 and the dielectric layer 3. A second contact-enhancing layer 8 is situated between the dielectric layer 3 and the semiconducting layer 4. Like the first layer 7, layer 8 is also comprised of a bifunctional molecular agent that forms an interface to interact either chemically or physically with the two opposing surfaces that it contacts to form a stable bond between the dielectric layer 3 and the semiconducting layer 4. A third contact-enhancing layer 9 is situated between the semiconducting layer 4 and the source/drain electrodes 5, 6. Like the second layer 8, layer 9 is also comprised of a bifunctional molecular agent that forms an interface to interact either chemically or physically with the two opposing surfaces that it contacts to form a stable bond between the semiconducting layer 4 and the source/drain electrodes 5, 6.

Figure 10:
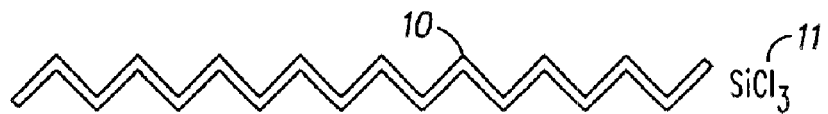
FIG. 10 is a schematic representation of a structural formula for one embodiment of a contact-enhancing agent in accordance with the invention.
Figure 11:
FIG. 11 is a schematic representation of a structural formula for another embodiment of a contact-enhancing agent in accordance with the invention.
Figure 12:
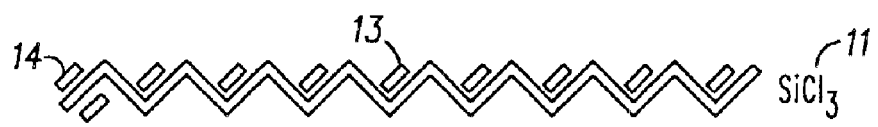
FIG. 12 is a schematic representation of a structural formula for yet another embodiment of a contact-enhancing agent in accordance with the invention.

Having now described the mechanical structure of our organic field effect transistor, we now turn to a discussion of the contact-enhancing agent. Molecular agents typically form pseudo monolayer structures at the surface to which they are bound. While it is possible for these agents to completely cover the surface to which they couple with one application, several applications may be required to create an interface layer having desirable properties. Our molecular agents are multifunctional in nature. By that we mean that one end of the molecule has a functional group that is able to bind to, for example, a metal or metal oxide surface, such as gold, copper aluminum, titanium or their oxides such as may be employed in the gate, source, and drain electrodes, while the other end of the molecule may have a functional group that binds to, for example, a dielectric polymer (polyimides, for example) or an organic semiconductor such as the thiophene polymers commonly used in OFETs. Depending on the application, one may choose to utilize a molecular agent having two different types of functional groups at the respective ends of the molecule, or one may choose to utilize a molecule having two similar types of functional groups at the respective ends of the molecule. For example, if the agent were used to bond the gate electrode to the dielectric layer, one would clearly use a material that has a functional group at one end that bonds well to a metal or metal oxide, and a functional group at the other end that binds well to a non-polar material such as the dielectric layer. Likewise, in the case of bonding the semiconducting layer to the dielectric layer, one would choose the appropriate functional groups. One of ordinary skill in the chemical arts will appreciate that the various types of functional groups to be used on this bifunctional contact-enhancing agent need to be selected based on knowledge of the chemistry of the various layers of the OFET. One example of a contact-enhancing molecular agent that displays good adhesion to various materials is schematically depicted in FIG. 10, where a long chain alkane group 10 is chemically bonded to a trichlorosilarie terminus 11. The long chain alkane group 10 is a hydrocarbon chain selected from the group consisting of $(CH_2)x$ where x is an integer from 12 to 18. One particular material we have found useful is octadecyl-di(trichlorosilane), $SiCl_3(CH2)18SiCl3$. In the case of octadecyl-di(trichlorosilane), the functional group at each end of the hydrocarbon chain is a chlorosilane, that preferentially binds to the respective surfaces. A long chain chlorosilane material that has unsaturation at one end 12 is shown in FIG. 11. This material has an alkane backbone, but the double bond between the last two carbons provides an additional type of functionality that reactively couples to various surfaces. Another class of material that provides enhanced carrier Injection to the semiconducting layer is shown in FIG. 12 where the backbone 13 is an alkene with a triple bond 14 at the end of the chain. To one skilled in the art, notwithstanding any aforementioned examples, there are many other chemical modifications that can be made to create the molecular agents, depending on the function and properties desired.

The following are examples of other molecular agents that are useful as contact-enhancing agents at the various interfaces:

$(RO)_3Si(CH_2)_xSiCl_3$ where R is alkyl group containing from 1 to 5 carbon atoms and where x is an integer from 12 to 18, for example $(CH_3O)_3Si(CH_{2)16}SiCl_3$ $(RO)_3Si(CH_2)_xSi(OR)_3$ where R is an alkyl group containing from 1 to 5 carbons and where x is an integer from 12 to 18, for example $(CH_3O)_3Si(CH_2)_{16}Si(OCH_3)_3$ $R(CH_2)_xR'$ where x is an integer from 12 to 18, R is thiophene, pyrrole substituted in either the 2 or 3 position or chlorosilane, and R' is a reactive organic moiety such as an alcohol, amine, organic acid or ethene, for example: $SCHCHCHC(CH_2)_{14}NH_2$ and $SCHCHCHC(CH_2)_{13}COOH$, and $HNCHCHCHC(CH_2)_{14}NH_2$ and $HNCHCHCHC(CH_2)_{13}COOH$ and $SiCl_3(CH_2)_{13}CH=CH_2$

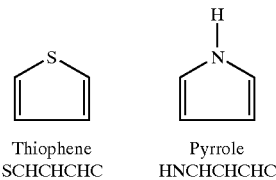

Thiophene    Pyrrole
SCHCHCHC    HNCHCHCHC $R(CH_2)_xR'$ where x is an integer from 12 to 18, R is thiophene, pyrrole substituted in either the 2 or 3 position, or chlorosilane and R' is a nonreactive organic moiety such as methyl, for example: $SCHCHCHC(CH_2)_{13}CH_3$ and $HNCHCHCHC(CH_2)_{14}$ CH3 and $SiCl_3(CH_2)_{13}CH_3$ $R(CH=CH)_yR'$ where y is an integer from 1 to 9, R is thiophene, pyrrole substituted in either the 2 or 3 position, chlorosilane or amine and R' is a reactive organic moiety such as alcohol or ethyne, for example: $SCHCHCHC(CH=CH)_7C\equiv CH$ and $HNCHCHCHC(CH=CH)_7C\equiv CH$ and $SiCl_3(CH=CH)_7C\equiv CH$ and $H_2N(CH=CH)_7C\equiv CH$ and $H_2N(CH=CH)_8NH_2$ $R(CH=CH)_yR'$ where y is an integer from 1 to 9, R is thiophene, pyrrole substituted in either the 2 or 3 position or chlorosilane and R' is a nonreactive organic moiety such as ethene, for example: $SCHCHCHC(CH=CH)_7C=CH_2$ and $HNCHCHCHC(CH=CH)_7CH=CH_2$ and $SiCl_3(CH=CH)_7C=CH_2$ $R(C_6H_5)_nR'$ where n is an integer from 2 to 8, R is an alcohol, amine or organic acid, and R' is an alcohol, amine or organic acid, for example: $H_2N(C_6H_5)_7NH_2$ and $HOOC(C_6H_5)_7COOH$ and $H_2N(C_6H_5)_7COOH$ Thus, any examples used in the teaching of this invention with regard molecular agents are not intended to limit the scope of the invention nor its teachings. For example, the length of the hydrocarbon chain can be easily altered, that is, one may use, for example, a 12–18 carbon chain, with unsaturation sites from 0–18.

Figure 9:
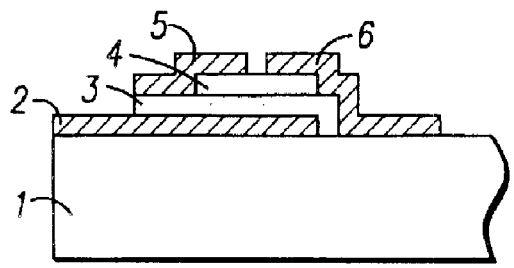
FIG. 9 is a cross-sectional schematic representation of an organic field effect transistor having a dielectric layer comprising a bifunctional molecular agent in accordance with another embodiment of the present invention.

Referring now to FIG. 9, another embodiment of our invention, many of the molecular agents listed above can also be used to actually create the dielectric layer 3, since they are inherently non-conductive. In this case, the molecular agents are applied in a fashion so as to create a layer thick enough to be pinhole free and to function as a dielectric material, thus obviating the need to employ a separate dielectric layer, as in the prior art. Since the selected molecular agent is also a bifunctional material, in this embodiment it serves to not only act as the dielectric layer but also to enhance the adhesion between the underlying gate electrode and the superimposed semiconducting layer. The following are examples of molecular agents that can be used to form a dielectric layer that adheres well to the adjacent layers:

$(RO)_3Si(CH_2)_xSiCl_3$ where R is alkyl group containing from 1 to 5 carbon atoms and where x is an integer from 12 to 18, for example $(CH_3O)_3Si(CH_2)_{16}SiCl_3$ $(RO)_3Si(CH_2)_xSi(OR)_3$ where R is an alkyl group containing from 1 to 5 carbons and where x is an integer from 12 to 18, for example $(CH_3O)_3Si(CH_2)_{16}Si(OCH_3)_3$ $R(CH_2)_xR'$ where x is an integer from 12 to 18, R is thiophene, pyrrole substituted in either the 2 or 3 position or chlorosilane, and R' is a reactive organic moiety such as an alcohol, amine, organic acid or ethene, for example: $SCHCHCHC(CH_2)_{14}NH_2$ and $SCHCHCHC(CH_2)_{13}COOH$, and $HNCHCHCHC(CH_2)_{14}NH2$ and $HNCHCHCHC(CH_2)_{13}COOH$ and $SiCl_3(CH_2)_{13}CH=CH_2$ $R(CH_2)_xR'$ where x is an integer from 12 to 18, R is thiophene, pyrrole substituted in either the 2 or 3 position, or chlorosilane and R' is a nonreactive organic moiety such as methyl, for example: $SCHCHCHC(CH_2)_{13}CH_3$ and $HNCHCHCHC(CH_2)_{14}$ $CH_3$ and $SiCl_3(CH_2)_{13}CH_3$ In summary, the present invention is implemented using a bifunctional contact-enhancing agent initially applied in liquid form in conjunction with an organic field effect transistor. The agent can be deposited at various interfaces so as to enhance the adhesion of the layers, to enhance mobility through the organic semiconductor layer, and/or to enhance carrier injection to improve electrical performance of the OFET. Those skilled in the art will appreciate that the contact-enhancing agent used in association with an OFET to implement the embodiments described herein can be realized using many suitable techniques well known to the electronics and coating industries, and that while several bifunctional hydrocarbon molecules having chlorosilane, amine, acid, alcohol, thiophene, pyrrole, alkoxy, alkane, alkene and alkyne moieties have been described, many others can be formulated to exhibit the desired bifunctionality and reactivity by employing the teachings of our invention. While the invention has been described in conjunction with specific embodiments, it is evident that many alternatives, modifications, permutations and variations will become apparent to those of ordinary skill in the art in light of the foregoing description. For example, the arrangement of the various layers in the OFET could be reversed, that is, the source and drain electrodes disposed on the substrate and the gate electrode situated as the top layer. Or, all three electrodes could be disposed on the substrate, but electrically isolated from each other. To extend this modification even further, when all three electrodes are disposed on the substrate, one can optionally eliminate the dielectric layer and place the semiconducting layer directly on top of all three electrodes, as in a conventional MESFET. In this situation, the molecular agent is placed at the interface region that lies between the source electrode and the semiconducting layer and at the interface region that lies between the drain electrode and the semiconducting layer. A molecular agent can also be optionally placed in the interface region between the gate electrode and the semiconducting layer. Accordingly, it is intended that the present invention embrace all such alternatives, modifications and variations as fall within the scope of the appended claims.

What is claimed is:

1. An organic field effect transistor, comprising:
   a substrate;
   a gate electrode, a source electrode and a drain electrode, at least one of said electrodes disposed on the substrate;
   a dielectric layer in contact with the gate electrode;
   an organic semiconducting layer in contact with the dielectric layer; the source electrode and the drain electrode in contact with the organic semiconducting layer;
   a first interface region situated between the gate electrode and the dielectric layer;
   a second interface region situated between the dielectric layer and the organic semiconducting layer;
   a third interface region situated between the organic semiconducting layer and the source or drain electrodes; and
   a bifunctional contact-enhancing agent situated in at least one of said interface regions so as to form a chemical or physical bond between adjacent said layers or said electrodes, said bifunctional contact-enhancing agent comprising one or more materials selected from the group consisting of:
   $(RO)_3Si(CH_2)_xSiCl_3$ where R is alkyl group containing from 1 to 5 carbon atoms and x is an integer from 12 to 18,
   $(RO)_3Si(CH_2)_xSi(OR')_3$ where R and R' are alkyl groups containing from 1 to 5 carbon atoms and x is an integer from 12 to 18,
   $R(CH_2)_xR'$ where R is selected from the group consisting of thiophene, pyrrole substituted in either the 2 or 3 positions, and chlorosilane and where x is an integer from 12 to 18 and R' is a reactive organic moiety selected from the group consisting of alcohol, amine, organic acid, and ethene,
   $R(CH_2)_xR'$ where R is selected from the group consisting of thiophene, pyrrole substituted in either the 2 or 3 positions, and chlorosilane and where x is an integer from 12 to 18 and R' is a nonreactive organic moiety,
   $R(CH=CH)_yR'$ where R is selected from the group consisting of thiophene, pyrrole substituted in either the 2 or 3 positions, chlorosilane, and amine and where y is an integer from 1 to 9 and R' is a reactive organic moiety,
   $R(CH=CH)_yR'$ where R is selected from the group consisting of thiophene, pyrrole substituted in either the 2 or 3 positions, and chlorosilane and where y is an integer from 1 to 9 and R' is a nonreactive organic moiety, and
   $R(C_6H_5)_nR'$ where R and R' is an alcohol, amine or organic acid and n is an integer from 2 to 8.

2. The organic field effect transistor as described in claim 1, wherein the bifunctional contact-enhancing agent comprises one or more materials selected from the group consisting of $(CH_3O)_3Si(CH_2)_{16}SiCl_3$, $(CH_3O)_3Si(CH_2)_{16}Si(OCH_3)_3$, $SCHCHCHC(CH_2)_{14}NH_2$, $SCHCHCHC(CH_2)_{13}COOH$, $HNCHCHCHC(CH_2)_{14}NH_2$, $HNCHCHCHC(CH_2)_{13}COOH$, $SiCl_3(CH_2)_{13}CH=CH_2$, $SCHCHCHC(CH_2)_{13}CH_3$, $HNCHCHCHC(CH_2)_{14}CH_3$, $SiCl_3(CH_2)_{13}CH_3$, $SCHCHCHC(CH=CH)_7C\equiv CH$, $HNCHCHCHC(CH=CH)_7C\equiv CH$, $SiCl_3(CH=CH)_7C\equiv CH$, $H_2N(CH=CH)_7C\equiv CH$, $H_2N(CH=CH)_8NH_2$, $SCHCHCHC(CH=CH)_7C=CH_2$, $HNCHCHCHC(CH=CH)_7CH=CH_2$, $SiCl_3(CH=CH)_7C=CH_2$, $H_2N(C_6H_5)_7NH_2$, $HOOC(C_6H_5)_7COOH$, and $H_2N(C_6H_5)_7COOH$.

3. An organic field effect transistor having a contact-enhancing agent between a gate electrode and a dielectric layer, comprising:
   a substrate;
   a gate electrode, a source electrode and a drain electrode, at least one of said electrodes disposed on the substrate;
   a dielectric layer in contact with the gate electrode;
   a bifunctional contact-enhancing agent situated between the gate electrode and the dielectric layer, said bifunctional agent forming a chemical or physical bond between the gate electrode and the dielectric layer;
   an organic semiconducting layer in contact with the dielectric layer; and
   a source electrode and a drain electrode in contact with the organic semiconducting layer.

4. The organic field effect transistor as described in claim 3, wherein the bifunctional contact-enhancing agent is an organic chlorosilane.

5. The organic field effect transistor as described in claim 4, wherein the organic chlorosilane further comprises a trichlorosilane or an alkoxy silane.

6. The organic field effect transistor as described in claim 4, wherein the organic chlorosilane contains an alkane backbone.

7. The organic field effect transistor as described in claim 4, wherein the organic chlorosilane contains an alkene backbone.

8. The organic field effect transistor as described in claim 3, wherein the dielectric layer comprises an organic gate insulating layer.

9. The organic field effect transistor as described in claim 3, wherein the bifunctional contact-enhancing agent comprises one or more materials selected from the group consisting of $(CH_3O)_3Si(CH_2)_{16}SiCl_3$, $(CH_3O)_3Si(CH_2)_{16}Si(OCH_3)_3$, $SCHCHCHC(CH_2)_{14}NH_2$, $SCHCHCHC(CH_2)_{13}COOH$, $HNCHCHCHC(CH_2)_{14}NH_2$, $HNCHCHCHC(CH_2)_{13}COOH$, $SiCl_3(CH_2)_{13}CH=CH_2$, $SCHCHCHC(CH_2)_{13}CH_3$, $HNCHCHCHC(CH_2)_{14}CH_3$, $SiCl_3(CH_2)_{13}CH_3$, $SCHCHCHC(CH=CH)_7C\equiv CH$, $HNCHCHCHC(CH=CH)_7C\equiv CH$, $SiCl_3(CH=CH)_7C\equiv CH$, $H_2N(CH=CH)_7C\equiv CH$, $H_2N(CH=CH)_8NH_2$, $SCHCHCHC(CH=CH)_7C=CH_2$, $HNCHCHCHC(CH=CH)_7CH=CH_2$, $SiCl_3(CH=CH)_7C=CH_2$, $H_2N(C_6H_5)_7NH_2$, $HOOC(C_6H_5)_7COOH$, and $H_2N(C_6H_5)_7COOH$.

10. The organic field effect transistor as described in claim 4, wherein the organic chlorosilane comprises $(CH_3O)_3Si(CH_2)_{16}SiCl_3$.

11. The organic field effect transistor as described in claim 4, wherein the organic chlorosilane comprises $(CH_3O)_3Si(CH_2)_{16}Si(OCH_3)_3$.

12. The organic field effect transistor as described in claim 3, further comprising:
a second bifunctional contact-enhancing agent situated between the electrodes and the organic semiconducting layer, said second bifunctional agent forming a chemical or physical bond between the electrodes and the organic semiconducting layer.

13. The organic field effect transistor as described in claim 3, further comprising:
a second bifunctional contact-enhancing agent situated between the dielectric layer and the organic semiconducting layer, said second bifunctional agent forming a chemical or physical bond between the dielectric layer and the organic semiconducting layer.

14. The organic field effect transistor as described in claim 3, further comprising:
a second bifunctional contact-enhancing agent situated between the dielectric layer and the organic semiconducting layer, said second bifunctional agent forming a chemical or physical bond between the dielectric layer and the organic semiconducting layer; and
a third bifunctional contact-enhancing agent situated between the electrodes and the organic semiconducting layer, said third bifunctional agent forming a chemical or physical bond between the electrodes and the organic semiconducting layer.

15. An organic field effect transistor having a contact-enhancing agent between a dielectric layer and an organic semiconducting layer for enhancing mobility through the semiconducting layer, comprising:
a substrate;
a gate electrode, a source electrode and a drain electrode, at least one of said electrodes disposed on the substrate;
a dielectric layer in contact with the gate electrode;
an organic semiconducting layer in contact with the dielectric layer;
a bifunctional contact-enhancing agent situated between the dielectric layer and the organic semiconducting layer, said bifunctional agent forming a chemical or physical bond between the dielectric layer and the organic semiconducting layer; and
a source electrode and a drain electrode in contact with the organic semiconducting layer.

16. The organic field effect transistor as described in claim 15, wherein the bifunctional contact-enhancing agent comprises one or more materials selected from the group consisting of $(CH_3O)_3Si(CH_2)_{16}SiCl_3$, $(CH_3O)_3Si(CH_2)_{16}Si(OCH_3)_3$, $SCHCHCHC(CH_2)_{14}NH_2$, $SCHCHCHC(CH_2)_{13}COOH$, $HNCHCHCHC(CH_2)_{14}NH_2$, $HNCHCHCHC(CH_2)_{13}COOH$, $SiCl_3(CH_2)_{13}CH=CH_2$, $SCHCHCHC(CH_2)_{13}CH_3$, $HNCHCHCHC(CH_2)_{14}CH_3$, $SiCl_3(CH_2)_{13}CH_3$, $SCHCHCHC(CH=CH)_7C\equiv CH$, $HNCHCHCHC(CH=CH)_7CH\equiv CH$, $SiCl_3(CH=CH)_7C\equiv CH$, $H_2N(CH=CH)_7C\equiv CH$, $H_2N(CH=CH)_8NH_2$, $SCHCHCHC(CH=CH)_7C=CH_2$, $HNCHCHCHC(CH=CH)_7CH=CH_2$, $SiCl_3(CH=CH)_7C=CH_2$, $H_2N(C_6H_5)_7NH_2$, $HOOC(C_6H_5)_7COOH$, and $H_2N(C_6H_5)_7COOH$.

17. The organic field effect transistor as described in claim 15, further comprising:
a second bifunctional contact-enhancing agent situated between the electrodes and the organic semiconducting layer, said second bifunctional agent forming a chemical or physical bond between the electrodes and the organic semiconducting layer.

18. An organic field effect transistor having a contact-enhancing agent between a source electrode and a drain electrode and an organic semiconducting layer, for improving carrier injection, comprising:
a substrate;
a gate electrode, a source electrode and a drain electrode, at least one of said electrodes disposed on the substrate;
a dielectric layer in contact with the gate electrode;
an organic semiconducting layer in contact with the dielectric layer;
a source electrode and a drain electrode in contact with the organic semiconducting layer; and
a bifunctional contact-enhancing agent situated between the electrodes and the organic semiconducting layer, said bifunctional agent forming a chemical or physical bond between the electrodes and the organic semiconducting layer.

19. The organic field effect transistor as described in claim 18, wherein the bifunctional contact-enhancing agent comprises one or more materials selected from the group consisting of $(CH_3O)_3Si(CH_2)_{16}SiCl_3$, $(CH_3O)_3Si(CH_2)_{16}Si(OCH_3)_3$, $SCHCHCHC(CH_2)_{14}NH_2$, $SCHCHCHC(CH_2)_{13}COOH$, $HNCHCHCHC(CH_2)_{14}NH_2$, $HNCHCHCHC(CH_2)_{13}COOH$, $SiCl_3(CH_2)_{13}CH=CH_2$, $SCHCHCHC(CH_2)_{13}CH_3$, $HNCHCHCHC(CH_2)_{14}CH_3$, $SiCl_3(CH_2)_{13}CH_3$, $SCHCHCHC(CH=CH)_7C\equiv CH$, $HNCHCHCHC(CH=CH)_7C\equiv CH$, $SiCl_3(CH=CH)_7C\equiv CH$, $H_2N(CH=CH)_7C\equiv CH$, $H_2N(CH=CH)_8NH_2$, $SCHCHCHC(CH=CH)_7C=CH_2$, $HNCHCHCHC(CH=CH)_7CH=CH_2$, $SiCl_3(CH=CH)_7C=CH_2$, $H_2N(C_6H_5)_7NH_2$, $HOOC(C_6H_5)_7COOH$, and $H_2N(C_6H_5)_7COOH$.

20. An improved organic field effect transistor having a gate electrode layer disposed on a substrate, a dielectric layer over the gate electrode layer, an organic semiconducting layer on the dielectric layer, and source and drain electrode layers disposed in contact with the organic semiconducting layer, comprising a bifunctional contact-enhancing agent disposed between two or more of the layers.

21. The organic field effect transistor as described in claim 20, wherein the bifunctional contact-enhancing agent comprises one or more materials selected from the group consisting of $(CH_3O)_3Si(CH_2)_{16}SiCl_3$, $(CH_3O)_3Si(CH_2)_{16}Si(OCH_3)_3$, $SCHCHCHC(CH_2)_{14}NH_2$, $SCHCHCHC(CH_2)_{13}COOH$, $HNCHCHCHC(CH_2)_{14}NH_2$, $HNCHCHCHC(CH_2)_{13}COOH$, $SiCl_3(CH_2)_{13}CH=CH_2$, $SCHCHCHC(CH_2)_{13}CH_3$, $HNCHCHCHC(CH_2)_{14}\ CH_3$, $SiCl_3(CH_2)_{13}CH_3$, $SCHCHCHC(CH=CH)_7C\equiv CH$, $HNCHCHCHC(CH=CH)_7C\equiv CH$, $SiCl_3(CH=CH)_7C\equiv CH$, $H_2N(CH=CH)_7C\equiv CH$, $H_2N(CH=CH)_8NH_2$, $SCHCHCHC(CH=CH)_7C=CH_2$, $HNCHCHCHC(CH=CH)_7CH=CH_2$, $SiCl_3(CH=CH)_7C=CH_2$, $H_2N(C_6H_5)_7NH_2$, $HOOC(C_6H_5)_7COOH$, and $H_2N(C_6H_5)_7COOH$.

22. The improved organic field effect transistor as described in claim 20, wherein the bifunctional contact-enhancing agent comprises $SiCl_3(CH_2)_xSiCl_3$ where x is an integer from 12 to 18.

23. The improved organic field effect transistor as described in claim 20, wherein the bifunctional contact-enhancing agent comprises hydrocarbon chain having a terminal chlorosilane.

24. The improved organic field effect transistor as described in claim 23, wherein the terminal chlorosilane comprises $SiCl_3$.

25. The improved organic field effect transistor as described in claim 23, wherein the hydrocarbon chain is selected from the group consisting of $(CH_2)_x$ where x is an integer from 12 to 18.

26. An organic field effect transistor, comprising:

a substrate;

a gate electrode, a source electrode and a drain electrode, at least one of said electrodes disposed on the substrate;

a dielectric layer in contact with the gate electrode, said dielectric layer comprising a molecular agent selected from the group consisting of $(RO)_3Si(CH_2)_xSiCl_3$ where R is alkyl group containing from 1 to 5 carbon atoms and x is an integer from 12 to 18, $(RO)_3Si(CH_2)_xSi(OR')_3$ where R and R' are alkyl groups containing from 1 to 5 carbon atoms and x is an integer from 12 to 18, $R(CH_2)_xR'$ where R is selected from the group consisting of thiophene, pyrrole substituted in either the 2 or 3 positions, and chlorosilane and where x is an integer from 12 to 18 and R' is a reactive organic moiety selected from the group consisting of alcohol, amine, organic acid, and ethene, and $R(CH_2)_xR'$ where R is selected from the group consisting of thiophene, pyrrole substituted in either the 2 or 3 positions, and chlorosilane and where x is an integer from 12 to 18 and R' is a nonreactive organic moiety;

an organic semiconducting layer in contact with the dielectric layer; and the source electrode and the drain electrode in contact with the organic semiconducting layer.

27. The organic field effect transistor as described in claim 26, wherein the dielectric layer comprises one or more materials selected from the group consisting of $(CH_3O)_3Si(CH_2)_{16}SiCl_3$, $(CH_3O)_3Si(CH_2)_{16}Si(OCH_3)_3$, $SCHCHCHC(CH_2)_{14}NH_2$, $SCHCHCHC(CH_2)_{13}COOH$, $HNCHCHCHC(CH_2)_{14}NH_2$, $HNCHCHCHC(CH_2)_{13}COOH$, $SiCl_3(CH_2)_{13}CH=CH_2$, $SCHCHCHC(CH_2)_{13}CH_3$, $HNCHCHCHC(CH_2)_{14}CH_3$, $SiCl_3(CH_2)_{13}CH_3$.

28. An organic field effect transistor, comprising:

a substrate;

a gate electrode, a source electrode and a drain electrode, each of said electrodes disposed on the substrate;

an organic semiconducting layer overlying said electrodes and in contact with each electrode;

a first interface region situated between the gate electrode and the organic semiconducting layer;

second interface regions situated between the source electrode and the organic semiconducting layer and between the drain electrode and the organic semiconducting layer; and a bifunctional contact-enhancing agent situated in at least one of said interface regions so as to form a chemical or physical bond between adjacent said layers or said electrodes, said bifunctional contact-enhancing agent comprising one or more materials selected from the group consisting of:

$(RO)_3Si(CH_2)_xSiCl_3$ where R is alkyl group containing from 1 to 5 carbon atoms and x is an integer from 12 to 18, $(RO)_3Si(CH_2)_xSi(OR')_3$ where R and R' are alkyl groups containing from 1 to 5 carbon atoms and x is an integer from 12 to 18, $R(CH_2)_xR'$ where R is selected from the group consisting of thiophene, pyrrole substituted in either the 2 or 3 positions, and chlorosilane and where x is an integer from 12 to 18 and R' is a reactive organic moiety selected from the group consisting of alcohol, amine, organic acid, and ethene, $R(CH_2)_xR'$ where R is selected from the group consisting of thiophene, pyrrole substituted in either the 2 or 3 positions, and chlorosilane and where x is an integer from 12 to 18 and R' is a nonreactive organic moiety, $R(CH=CH)_yR'$ where R is selected from the group consisting of thiophene, pyrrole substituted in either the 2 or 3 positions, chlorosilane, and amine and where y is an integer from 1 to 9 and R' is a reactive organic moiety, $R(CH=CH)_yR'$ where R is selected from the group consisting of thiophene, pyrrole substituted in either the 2 or 3 positions, and chlorosilane and where y is an integer from 1 to 9 and R' is a nonreactive organic moiety, and $R(C_6H_5)_nR'$ where R and R' is an alcohol, amine or organic acid and n is an integer from 2 to 8.

* * * * *